United States Patent
Peyerl et al.

(10) Patent No.: US 7,316,234 B2
(45) Date of Patent: Jan. 8, 2008

(54) MEDICAL IMAGING INSTALLATION AND OPERATING METHOD FOR READING STORED SIGNALS TO RECONSTRUCT A THREE-DIMENSIONAL IMAGE OF A SUBJECT

(75) Inventors: Michael Peyerl, Möhrendorf (DE); Peter Stransky, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 462 days.

(21) Appl. No.: 10/892,728

(22) Filed: Jul. 16, 2004

(65) Prior Publication Data

US 2005/0033882 A1 Feb. 10, 2005

(30) Foreign Application Priority Data

Jul. 16, 2003 (DE) .................. 103 32 245

(51) Int. Cl.
*G06F 3/00* (2006.01)
*G06F 5/00* (2006.01)
*A62B 5/05* (2006.01)
*A61B 5/05* (2006.01)

(52) U.S. Cl. .................. 128/922; 710/52; 710/56; 710/57; 600/410; 128/922

(58) Field of Classification Search ........... 710/52
See application file for complete search history.

(56) References Cited

U.S. PATENT DOCUMENTS

| 5,089,777 A | 2/1992 | Iino et al. |
| 5,758,345 A | 5/1998 | Wang |
| 2002/0019751 A1* | 2/2002 | Rothschild et al. ............ 705/3 |
| 2002/0055678 A1* | 5/2002 | Scott et al. ................. 600/423 |
| 2002/0153889 A1* | 10/2002 | Garwood et al. ........... 324/307 |
| 2002/0177771 A1* | 11/2002 | Guttman et al. ............ 600/410 |
| 2003/0206609 A1* | 11/2003 | Kling et al. ................... 378/4 |
| 2004/0195512 A1* | 10/2004 | Crosetto ............... 250/363.04 |

FOREIGN PATENT DOCUMENTS

WO WO 00/04483 1/2000

OTHER PUBLICATIONS

"Redundant Array of Inexpensive Disks: Redundancy is Good!" Kuhn, Linux Magazine, vol. 10 (2000) pp. 58-61.

* cited by examiner

*Primary Examiner*—Donald Sparks
*Assistant Examiner*—Brooke J Dews
(74) *Attorney, Agent, or Firm*—Schiff Hardin LLP

(57) ABSTRACT

In a method for operating a medical imaging installation, at least one sensor detects measured signals from an object and supplies them to a control device that buffer-stores the measured signals or raw signals ascertained therefrom online in the main memory. The buffer-stored signals contain components from a number of locations in space. Each component is dependent on a location-dependent influence factor that is determined by the object. The buffer-stored signal can be used to ascertain useful signals which respectively correspond to one of the influence factors, so that they form a three-dimensional reconstruction of the object. The control device permanently stores the buffer-stored signals online in the bulk memory.

12 Claims, 2 Drawing Sheets

MEDICAL IMAGING INSTALLATION AND OPERATING METHOD FOR READING STORED SIGNALS TO RECONSTRUCT A THREE-DIMENSIONAL IMAGE OF A SUBJECT

BACKGROUND OF THE INVENTION

1. Field of the Invention

The present invention relates to a method for operating an imaging medical installation, e.g. a computed tomography or magnetic resonance installation, the installation of the type having at least one sensor and a control device with a main memory and a bulk memory.

2. Description of the Prior Art

Installations of the above type are known wherein the sensor detects measured signals from an object and supplies them to the control device, which buffer-stores the measured signals or raw signals ascertained using the measured signals online in the main memory, and wherein each buffer-stored signal contains components from a number of locations in the space and each component is dependent on a location-dependent influence factor which is determined by the object, and wherein the buffer-stored signals can be used to ascertain useful signals which respectively correspond to one of the influence factors, so that the useful signals form a three-dimensional reconstruction of the object.

Such methods of operation are general knowledge in the field of imaging technology. In particular magnetic resonance imaging installations operate according to this principle.

Magnetic resonance imaging installations produce large volumes of measured signals at a high data rate. For example, a typical volume of data is several gigabytes, which are produced at a data rate of up to 100 megabytes per second.

Conventionally, although the measured signals or the raw signals are buffer-stored in the main memory online, permanent storage is undertaken only for the reconstructed useful signals. This practice has a number of drawbacks.

For example, the data are lost if there is a voltage dip. An uninterruptible voltage supply is therefore required in order to ensure data integrity.

A situation may also arise—particularly with parallel measured signal detection by a number of sensors—in which subsequent operations for processing the useful signals further give the first indication that an unfavorable method has been chosen for ascertaining the useful signals. In this case, a repeat measurement is required, since the measured signals themselves and also the raw signals are no longer available. This is disadvantageous, particularly when it is necessary to administer a contrast agent to an object to be examined (=a human) in order to take the measurement.

It is also necessary to ascertain the useful data immediately.

Finally, the main memory is relatively expensive and often can be produced only in a limited size in an installation.

SUMMARY OF THE INVENTION

An object of the present invention is to provide a method of operation for an imaging medical installation which avoids the aforementioned drawbacks of the prior art.

The object is achieved for a method of operation of the type by virtue initially described wherein the control device causes the signals that are buffer-stored in the main memory to be permanently stored online in the bulk memory.

This achieves a number of advantages. For example, the detected, permanently stored measured signals or raw signals can be used a number of times to ascertain the useful signals. It is also possible to decouple measurements or portions of measurements from one another over time. In addition, an uninterruptible voltage supply is no longer needed. Lastly, the permanently stored signals are also available for service purposes or for other measurements, e.g. calibrations.

If the bulk memory has a number of drive units and a data distributor that is upstream of the drive units and distributes the signals to be permanently stored over the drive units, then the method of operation is particularly easy to implement. To maximize the data throughput, the data distributor is preferably in the form of a hardware distributor in this arrangement. If a fast processor and a program with optimized throughput are used, then the data distributor alternatively may be in the form of a software distributor.

It is possible for the useful signals to be ascertained by the control device using the signals, which are buffer-stored in the main memory. In this case, the useful signals can be ascertained online only. Alternatively, it is possible for the useful signals to be ascertained by the control device using the signals that are permanently stored in the bulk memory. In this case, the useful signals can be ascertained both online and offline.

It is particularly efficient for the control device to ascertain a degree of filling for the main memory and to use the degree of filling to make a dynamic decision as to whether the control device will ascertain the useful signals using the signals that are buffer-stored in the main memory or using the signals that are permanently stored in the bulk memory.

If the main memory is in the form of a FIFO memory, then it is organized in simple fashion and is easy to manage. The degree of filling is also very easy to determine in this case.

DESCRIPTION OF THE PREFERRED EMBODIMENTS

Figure 1:
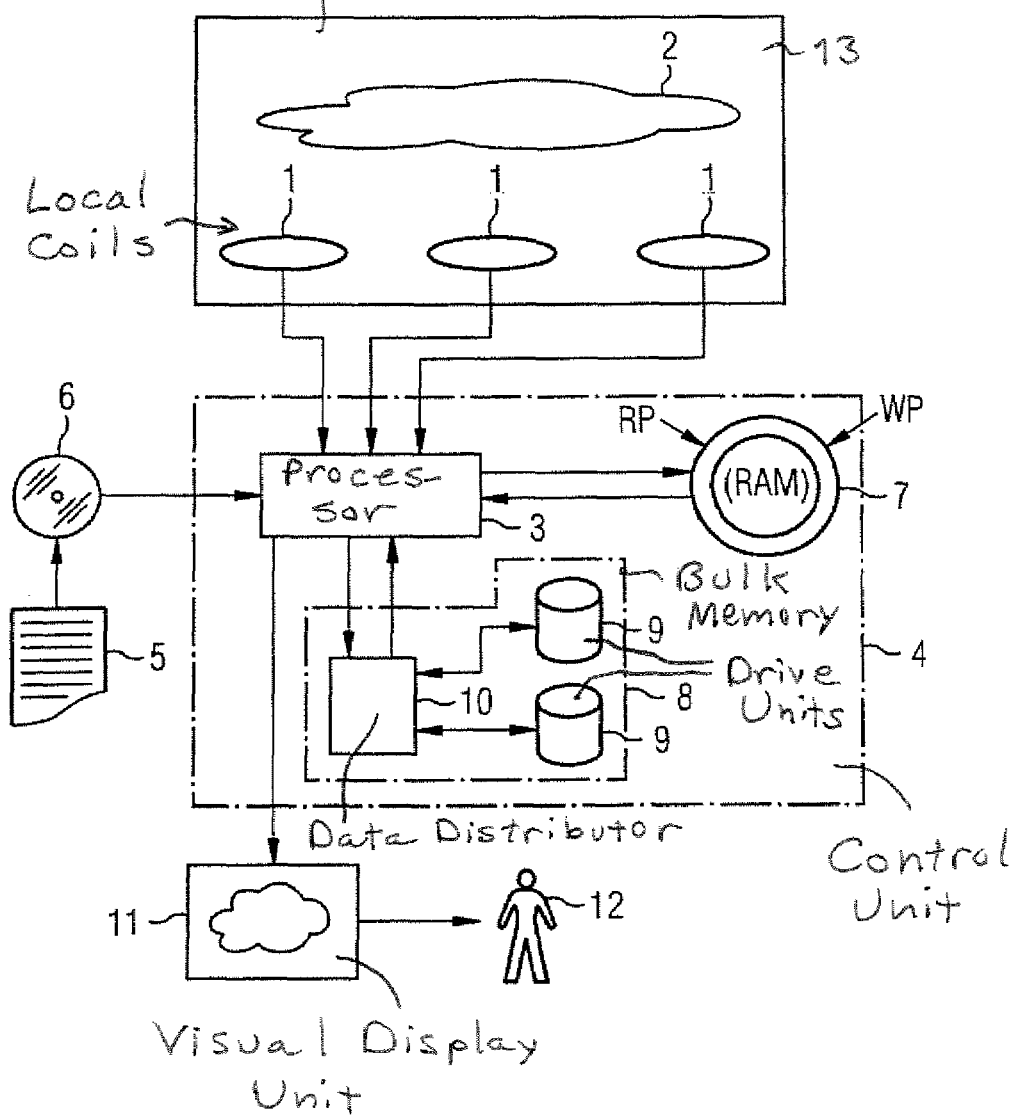
FIG. 1 schematically shows the basic components of a magnetic resonance imaging installation operable in accordance with the invention.

FIG. 1 shows a medical imaging installation in the form of a magnetic resonance installation 13, for example. The magnetic resonance installation 13 is shown only schematically in FIG. 1. It has a number of sensors, particularly in the form of local coils 1. The local coils 1 may be coils in a coil array, for example. FIG. 1 shows three such local coils 1. There may be more local coils 1, e.g. 5 to 20 local coils 1.

The local coils 1 detect measured signals from an object 2 and supply them to a processor 3 in a control device 4 for the magnetic resonance installation. The processor 3 has been programmed with a computer program 5 which is supplied to the processor 3 via a data storage medium 6. The data storage medium 6 may be in the form of a CD-ROM, for example, on which the computer program 5 is stored in (exclusively) machine-readable form. On the basis of the programming with the computer program 5, the processor 3 and, together therewith, the control device 4 carry out a method of operation (which is described in more detail below in conjunction with FIG. 2) for the magnetic resonance installation.

Figure 2:
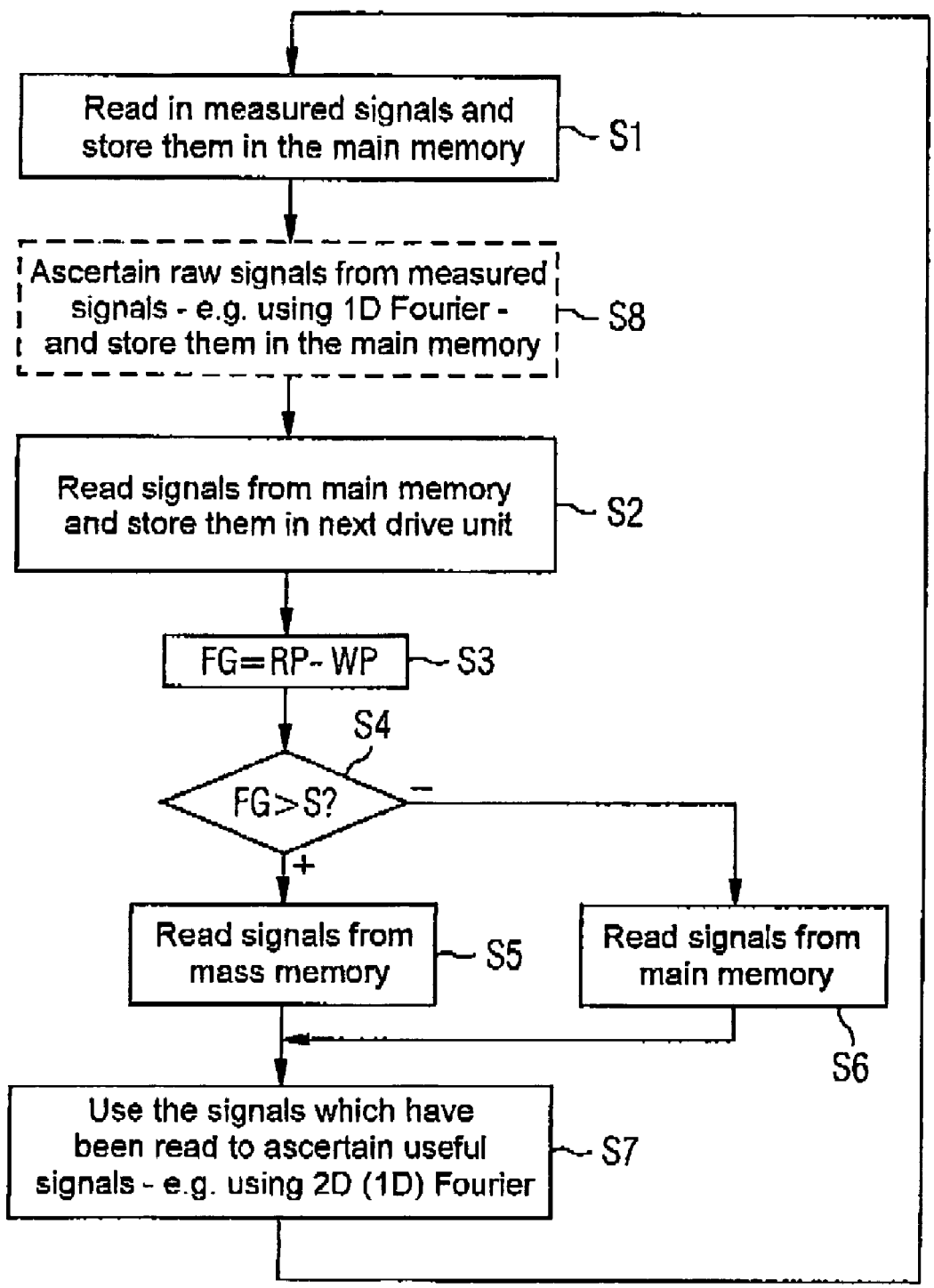
FIG. 2 is a flowchart showing the basic steps of the inventive method.

As shown in FIG. 2, the processor 3 reads in measured signals from the local coils 1 at a data rate which is typically between 10 and 200 megabytes per second in a step S1 and stores them in a main memory 7. In this case, buffer-storage takes place between two measurement operations, that is to say online. The main memory 7 is in the form of an ordinary volatile semiconductor memory (RAM). The data stored in the main memory 7 are therefore lost in the event of a dip in voltage.

The main memory 7 is organized as a cyclic buffer or as a FIFO memory—which is the same. It is thus managed by a read pointer RP and write pointer WP. The value of the read pointer RP indicates from which memory location in the main memory 7 data are read. The write pointer WP indicates to which memory location in the main memory 7 data are written. The two pointers RP, WP are continually updated by the processor 3.

Because the imaging medical installation is in the form of a magnetic resonance installation in the example, the measured signals have been frequency-coded in one dimension and phase-coded in one or two dimensions. Each measured signal thus contains components from a number of locations in space, namely at least one area, possibly even from the total three-dimensional space. In this case, each component is dependent on an influence factor, which is in turn location-dependent and is determined by the object 2.

In a step S2, the processor 3 reads the measured signals buffer-stored in the main memory 7 from the main memory 7 and stores them in a bulk memory 8. To this end, the bulk memory 8 has a number of drive units 9 which are each in the form of fast hard disks. Each of the drive units 9 has a capacity of at least 100 gigabytes. The measured signals are permanently stored in the bulk memory 8, which means that they are retained even in the event of an interruption in the voltage supply. Storage in the bulk memory 8 also takes place during the measurement operation, i.e. online.

As can be seen from FIG. 1, the bulk memory 8 also has, besides the drive units 9, a data distributor 10 which is arranged upstream of the drive units 9. In this arrangement, the data distributor 10 is preferably in the form of a hardware distributor 10. It may also be in the form of a software distributor, however. The data distributor 10 distributes the signals which are to be permanently stored over the drive units 9. The bulk memory 8 is thus in the form of a "RAID system". In this case, the operation of distributing the data is indicated in step 2 by referring therein to storage in the (respective) next drive unit 9.

In a step S3, the processor 3 forms the difference between the read pointer RP and the write pointer WP and thereby ascertains a degree of filling FG for the main memory 7. In a step S4, the processor 3 then checks whether the degree of filling FG exceeds a limit S. If this is the case, then a step S5 is performed, otherwise a step S6.

In step S5, the processor 3 reads the measured signals permanently stored in the bulk memory 8 from the bulk memory 8. In step S6, the processor 3 reads the measured signals buffer-stored in the main memory 7 from the main memory 7. In both cases, however, the processor 3 uses the measured signals which have been read to ascertain useful signals in a step S7. Each of the useful signals corresponds to one of the influence factors on which the measured signals are dependent. In total, the useful signals thus form a three-dimensional reconstruction of the object 2. In this case, the useful signals are ascertained from the measured signals through two-dimensional or three-dimensional Fourier transformation of the measured signals which have been read. The useful signals can then be used to ascertain a representation which—see FIG. 1—is output to an operator 12 by the control device 4 using a visual display unit 11, e.g. a screen.

In the case of the procedure described above with steps S3 to S7, the control device 4 thus ascertains the degree of filling FG for the main memory 7 and uses the degree of filling FG to make a dynamic decision regarding whether it ascertains the useful signals using the signals which are buffer-stored in the main memory 7 or using the measured signals which are permanently stored in the bulk memory 8. Alternatively, it is possible to dispense with steps S3, S4 and S6. In this case, the control device 4 always uses the measured signals which are permanently stored in the bulk memory 8 to ascertain the useful signals. If sufficiently fast access to the main memory 7 is possible, it is alternatively also possible to dispense with steps S3 to S5 and always to use the measured signals which are buffer-stored in the main memory 7 to ascertain the useful signals. The limit S may also be variable, which means that a hysteretic response is obtained, for example.

In the above-described example the main memory 7 and the bulk memory 8 are used to store the measured signals, i.e. the signals detected by the coils 1. In this case, the useful signals are ascertained using a two-dimensional or three-dimensional Fourier transform. It is alternatively possible, as indicated with dashes in FIG. 2, to provide a step S8 between steps S1 and S2. In this step S8, at least one-dimensional and at most two-dimensional Fourier transformation of the measured signals is performed and thus raw signals are ascertained. In this case, the permanently stored signals are the raw signals resulting from this preprocessing. To ascertain the useful signals, only at least one-dimensional and at most two-dimensional Fourier transformation is now required in step S7 in this case.

The procedure described above is not limited to application in a magnetic resonance imaging installations. In principle, it is also possible to use it in other imaging medical installations, e.g. in computer tomographs, ultrasound tomographs or angiograph installations. In all of these installations, large volumes of data comprising, in some cases, over one gigabyte are produced at high data rates of up to 100 megabytes per second.

The inventive procedure makes it possible to process the measured signals a plurality of times. If it has been established, by way of example, that selecting a suboptimal evaluation algorithm has achieved only suboptimal image quality, then the stored measured or raw data can be used to ascertain an optimized useful signal set. This is not possible in the prior art without taking a fresh measurement.

Although modifications and changes may be suggested by those skilled in the art, it is the intention of the inventors to embody within the patent warranted hereon all changes and modifications as reasonably and properly come within the scope of their contribution to the art.

We claim:

1. A method for operating a medical imaging installation having a sensor adapted for interaction with an examination subject, and a control device in communication with a main memory and a bulk memory with signals stored therein, comprising the steps of:

with said sensor, detecting measured signals from the examination subject in a signal acquisition procedure and supplying the measured signals to said control device, and said control device buffer-storing said measured signals, or raw signals derived from said measured signals, online in said main memory during said signal acquisition procedure;

each buffer-stored signal containing components from a plurality of spatial locations with each component being dependent on a location-dependent influence factor defined by the examination subject;

using either the buffer-stored signals or the signals stored in the bulk memory to ascertain useful signals respectively corresponding to one of said influence factors, to allow formation of a three-dimensional reconstruction of the examination subject from the useful signals; and in said control device, permanently storing the buffer-stored signals from the main memory online in the bulk memory during said signal acquisition procedure and in said control device, ascertaining a degree of filling of said main memory and using said degree of filling, making a dynamic decision regarding whether to ascertain the useful signals using the signals buffer-stored in the main memory, or using the signals permanently stored in the bulk memory.

2. A method as claimed in claim 1 wherein said bulk memory has a plurality of drive units and a data distributor associated therewith upstream of said drive units, and comprising the step of distributing, with said data distributor the signals to be permanently stored over the drive units.

3. A method as claimed in claim 2 comprising employing a hardware distributor as said data distributor.

4. A method as claimed in claim 2 comprising employing a software distributor as said data distributor.

5. A method as claimed in claim 1 comprising ascertaining said useful signals in said control device using the signals that are buffer-stored in the main memory.

6. A method as claimed in claim 1 comprising ascertaining the useful signals using the signals that are permanently stored in the bulk memory.

7. A method as claimed in claim 1 comprising employing a FIFO memory as said main memory.

8. A method as claimed in claim 1 comprising determining said useful signals from said buffer-storage signals by an at least one-dimensional Fourier transformation of the buffer-stored signals.

9. A computer-readable medium encoded with a computer program for operating a medical imaging installation, said medical imaging installation having a sensor adapted for interaction with an examination subject for detecting measured signals from the examination subject in a signal acquisition procedure, a control device supplied with the measured signals from the sensor, and a main memory in which signals are stored and a bulk memory in communication with said control device, said computer program, when said computer-readable medium is loaded into said control device, causing said control device to:

buffer-store the measured signals or raw signals ascertained using the measured signals, online in the main memory during said signal acquisition procedure, each of said buffer-stored signals containing components from a plurality of spatial locations and each component being dependent on a location-dependent influence factor defined by the examination subject;

to use either the buffer-stored signals or the signals stored in the bulk memory to ascertain useful signals respectively corresponding to one of said influence factors, for allowing formation of a three-dimensional reconstruction of the examination subject from the useful signals; and to cause the control device to permanently store the signals that are buffer-stored in the main memory online in the bulk memory during said signal acquisition procedure to ascertain a degree of filling of said main memory and to use said decree of filling, to make a dynamic decision regarding whether to ascertain the useful signals using the signals buffer-stored in the main memory, or using the signals permanently stored in the bulk memory.

10. A computer-readable medium as claimed in claim 9 wherein said computer program additionally causes said control device to determine said useful signals from said buffer-stored signals by an at least one-dimensional Fourier transformation of said buffer-stored signals.

11. A medical imaging installation comprising:

at least one sensor adapted for interaction with an examination subject for detecting measured signals from the examination subject in a signal acquisition procedure;

a control device supplied with said measured signals from said at least one sensor;

a main memory in communication with said control device;

a bulk memory, in communication with said control device, in which signals are stored; and said control device causing said measured signals, or raw signals ascertained using said measured signals, to be buffer-stored online in said main memory during said signal acquisition procedure, each buffer-stored signal containing components from a plurality of spatial locations, each component being dependent on a location-dependent influence factor defined by the examination subject, said control device ascertaining useful signals from said buffer-stored signals respectively corresponding to one of said influence factors either from the buffer-stored signals or the signal stored in the bulk memory, for forming a three-dimensional reconstruction of the examination subject from the useful signals, and said control device permanently storing the signals buffer-stored in the main memory online in said bulk memory during said signal acquisition procedure wherein said control device ascertains a degree of filling of said main memory and uses said degree of filling to make a dynamic decision regarding whether to ascertain the useful signals using the signals buffer-stored in the main memory, or using the signals permanently stored in the bulk memory.

12. A medical imaging installation as claimed in claim 11 wherein said control device ascertains said useful signals from said buffer-stored signals by an at least one-dimensional Fourier transformation of said buffer-stored signals.

* * * * *